United States Patent [19]

Shoji

[11] Patent Number: 4,835,781
[45] Date of Patent: May 30, 1989

[54] DROOPING ELIMINATION DEVICE FOR SEMICONDUCTOR LASER

[75] Inventor: Takashi Shoji, Kanagawa, Japan

[73] Assignee: Fuji Photo Film Co., Ltd., Kanagawa, Japan

[21] Appl. No.: 160,450

[22] Filed: Feb. 25, 1988

[30] Foreign Application Priority Data

Feb. 25, 1987 [JP] Japan .................................. 62-42110

[51] Int. Cl.$^4$ .............................................. H01S 3/13
[52] U.S. Cl. ...................................... 372/29; 372/33; 372/38
[58] Field of Search .................... 372/9, 24, 29, 33, 34, 372/38; 369/106, 116; 358/296, 300; 346/108, 160

[56] References Cited

U.S. PATENT DOCUMENTS

| | | | |
|---|---|---|---|
| 4,068,197 | 1/1978 | Yamazaki et al. | 372/29 |
| 4,631,728 | 12/1986 | Simons | 372/38 |
| 4,647,950 | 3/1987 | Nosaki et al. | 346/160 |
| 4,649,403 | 3/1987 | Miura | 346/160 |
| 4,698,817 | 10/1987 | Burley | 372/31 |
| 4,707,715 | 11/1987 | Miura | 346/160 |
| 4,710,779 | 12/1987 | Funaki et al. | 372/29 |
| 4,725,854 | 2/1988 | Ohtjuka et al. | 372/33 |
| 4,729,038 | 3/1988 | Miura et al. | 358/300 |
| 4,736,255 | 5/1988 | Miura et al. | 258/300 |
| 4,763,334 | 8/1988 | Shimada et al. | 372/33 |

FOREIGN PATENT DOCUMENTS

56-71374 11/1979 Japan .
56-115077 2/1980 Japan .
56-152372 4/1980 Japan .

Primary Examiner—William L. Sikes
Assistant Examiner—B. Randolph Holloway
Attorney, Agent, or Firm—Sughrue, Mion, Zinn, Macpeak, and Seas

[57] ABSTRACT

A drooping elimination device for a semiconductor laser is provided in a laser beam recording apparatus comprising a laser operation control circuit for producing a light emission level instructing signal corresponding to an image signal, and controlling a drive current for the semiconductor laser based on the light emission level instructing signal to modulate the intensity of a laser beam emitted by the semiconductor laser, and an optical output stabilizing circuit for detecting the intensity of the laser beam, and feeding a feedback signal corresponding to the detected intensity to the light emission level instructing signal. The drooping elimination device comprises a feedback line for detecting the drive current for the semiconductor laser and feeding a signal corresponding to the detected drive current to the light emission level instructing signal, and a high-pass filter having a time constant equal to the time constant of drooping characteristics of the semiconductor laser, and provided in the feedback line to receive the detected drive current.

5 Claims, 4 Drawing Sheets

F I G. 1

FIG. 5A APPLIED CURRENT 54 mA
0 mA

FIG. 5B CHIP TEMP.

10 °C

FIG. 5C OPTICAL OUTPUT 0 mW

FIG. 5D OPTICAL OUTPUT DURING CONTROL

0 mW

FIG. 5E OUTPUT VOLTAGE OF HIGH-PASS FILTER

DROOPING ELIMINATION DEVICE FOR SEMICONDUCTOR LASER

BACKGROUND OF THE INVENTION

1. Field of the Invention

This invention relates to a drooping elimination device for a semiconductor laser in a laser beam recording apparatus for recording a continuous tone image on a photosensitive material by scanning the photosensitive material with a laser beam whose optical intensity is modulated analog-wise in accordance with an image signal.

2. Description of the Prior Art

Light beam scanning recording apparatuses wherein a light beam is deflected by a light deflector and scanned on a photosensitive material for recording an image on the photosensitive material have heretofore been used widely. A semiconductor laser is one of the means used for generating a light beam in the light beam scanning recording apparatuses. The semiconductor laser has various advantages over a gas laser or the like in that the semiconductor laser is small, cheap and consumes little power, and that the laser beam can be modulated directly by changing the drive current.

Figures 2, 3:
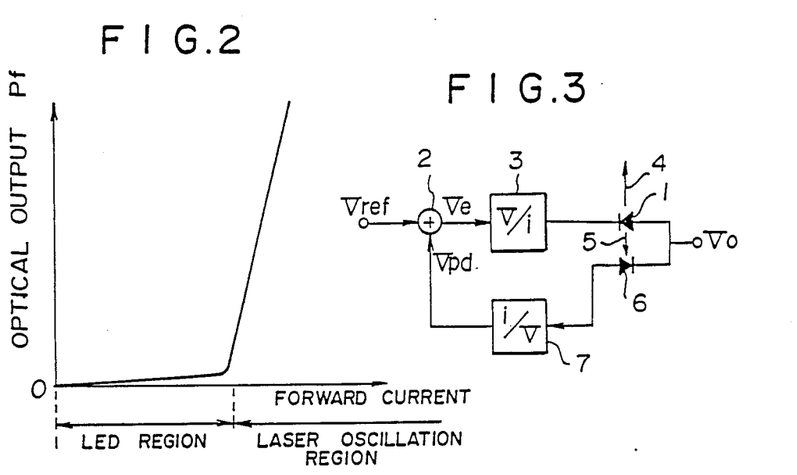
FIG. 2 is a graph showing the optical output characteristics of a semiconductor laser with respect to the drive current.
FIG. 3 is a block diagram showing an example of the circuit for stabilizing the optical output of the semiconductor laser.

FIG. 2 is a graph showing the optical output characteristics of the semiconductor laser with respect to the drive current. With reference to FIG. 2, the optical output characteristics of the semiconductor laser with respect to the drive current change sharply between a LED region (natural light emission region) and a laser oscillation region. Therefore, it is not always possible to apply the semiconductor laser to recording of a continuous tone image. Specifically, in the case where intensity modulation is carried out by utilizing only the laser oscillation region in which the optical output characteristics of the semiconductor laser with respect to the drive current are linear, it is possible to obtain a dynamic range of the optical output of only approximately 2 orders of magnitude at the most. As is well known, with a dynamic range of this order, it is impossible to obtain a continuous tone image having a high quality.

Accordingly, as disclosed in, for example, Japanese Unexamined Patent Publication Nos. 56(1981)-115077 and 56(1981)-152372, an attempt has been made to obtain a continuous tone image by maintaining the optical output of the semiconductor laser constant, continuously turning on and off the semiconductor laser to form a pulsed scanning beam, and controlling the number or the width of pulses for each picture element to change the scanning light amount.

However, in the case where the pulse number modulation or the pulse width modulation as mentioned above is carried out, in order to obtain a density scale, i.e. a resolution of the scanning light amount, of 10 bits (approximately 3 orders of magnitude) when the picture element clock frequency is 1 MHz for example, the pulse frequency must be adjusted to be very high (at least 1 GHz). Though the semiconductor laser itself can be turned on and off at such a high frequency, a pulse counting circuit or the like for control of the pulse number or the pulse width cannot generally be operated at such a high frequency. As a result, it becomes necessary to decrease the picture element clock frequency to a value markedly lower than the aforesaid value. Therefore, the recording speed of the apparatus must be decreased markedly.

Also, with the aforesaid method, the heat value of the semiconductor laser chip varies depending on the number or the widths of the pulses which are output during the recording period of each picture element, so that the optical output characteristics of the semiconductor laser with respect to the drive current change, and the exposure amount per pulse fluctuates. As a result, the gradation of the recorded image deviates from the correct gradation, and a continuous tone image of a high quality cannot be obtained.

On the other hand, as disclosed in Japanese Unexamined Patent Publication No. 56(1981)-71374 for example, it has been proposed to record a high-gradation image by combining pulse number modulation or pulse width modulation with optical intensity modulation. However, also with the proposed method, the heat value of the semiconductor laser chip varies depending on the number or the widths of the pulses which are output during the recording period of each picture element, so that the exposure amount per pulse fluctuates.

In view of the above, in order to record a high-gradation image of a density scale of approximately 10 bits, i.e. approximately 1024 levels of gradation, it is desired that a dynamic range of the optical output be adjusted to approximately 3 orders of ten by carrying out optical intensity modulation over the LED region and the laser oscillation region as shown in FIG. 2. However, the optical output characteristics of the semiconductor laser with respect to the drive current are not linear over the two regions. Therefore, in order to control the image density at an equal density interval for a predetermined difference among the image signals so that a high-gradation image can be recorded easily and accurately, it is necessary to make linear the relationship between the light emission level instructing signal and the optical output of the semiconductor laser by compensation of the optical output characteristics of the semiconductor laser with respect to the drive current.

As a circuit for making linear the relationship between the light emission level instructing signal and the optical output of the semiconductor laser, it has heretofore been known to use an optical output stabilizing circuit (an automatic power control circuit, hereinafter abbreviated to the APC circuit) for detecting the optical intensity of a laser beam and feeding back a feedback signal, which corresponds to the detected optical intensity, to the light emission level instructing signal for the semiconductor laser. FIG. 3 is a block diagram showing an example of the APC circuit. The APC circuit will hereinbelow be described with reference to FIG. 3. A light emission level instructing signal Vref for instructing the optical intensity of a semiconductor laser 1 is fed to a voltage-to-current conversion amplifier 3 via an addition point 2. The amplifier 3 feeds a drive current proportional to the light emission level instructing signal Vref to the semiconductor laser 1. A laser beam 4 emitted forward by the semiconductor laser 1 is utilized for scanning a photosensitive material via a scanning optical system (not shown). On the other hand, the intensity of a laser beam 5 emitted rearward from the semiconductor laser 1 is detected by a pin photodiode 6 disposed for optical amount monitoring, for example, in a case housing the semiconductor laser 1. The intensity of the laser beam 5 thus detected is proportional to the intensity of the laser beam 4 actually utilized for image recording. The output current of the pin photodiode 6 which represents the intensity of the laser beam 5, i.e.

the intensity of the laser beam 4, is converted into a feedback signal (voltage signal) Vpd by a current-to-voltage conversion amplifier 7, and the feedback signal Vpd is sent to the addition point 2. From the addition point 2, a deviation signal Ve representing a deviation between the light emission level instructing signal Vref and the feedback signal Vpd is output. The deviation signal Ve is converted into a current signal by the voltage-to-current amplifier 3 and is utilized for operating the semiconductor laser 1.

With the aforesaid APC circuit, the intensity of the laser beam 5 is proportional to the light emission level instructing signal Vref in the case where ideal linearity compensation is effected. Specifically, the intensity Pf of the laser beam 4 (i.e. the optical output of the semiconductor laser 1) utilized for image recording is proportional to the light emission level instructing signal Vref. However, it is not always possible to achieve such ideal linearity compensation. Therefore, as proposed in, for example, Japanese patent application No. 61(1986)248873, it is considered to provide a correction table for correcting the light emission level instructing signal so as to compensate for nonlinearity of the optical output characteristics of the semiconductor laser with respect to the drive current.

In the case where the light emission level instructing signal Vref is of a very low frequency that is close to a direct current, the relationship between the light emission level instructing signal and the optical intensity of the laser beam can be made linear by use of the aforesaid correction table.

Figure 4:
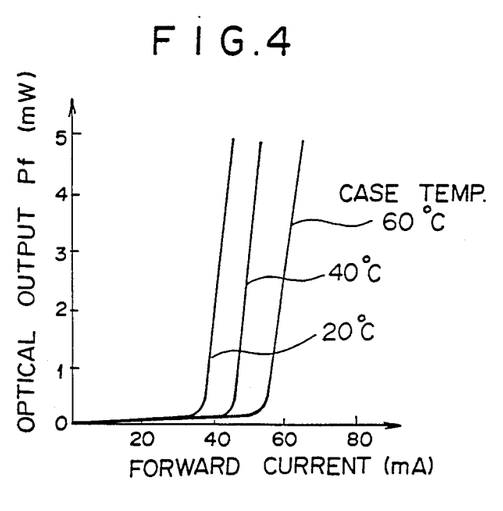
FIG. 4 is a graph showing dependence of the optical output characteristics of the semiconductor laser with respect to the drive current on the temperature.
Figure 5A:
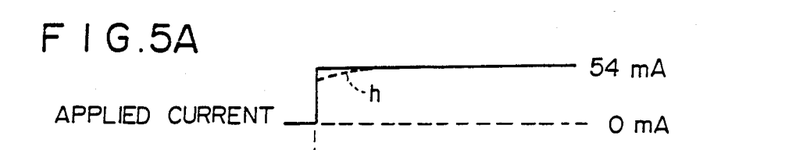
FIGS. 5A, 5B, 5C, 5D and 5E are explanatory graphs showing the drooping characteristics of the semiconductor laser.
Figure 5B:
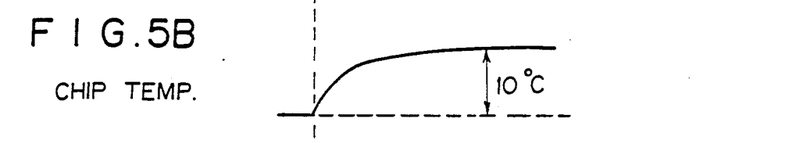
Figure 5C:
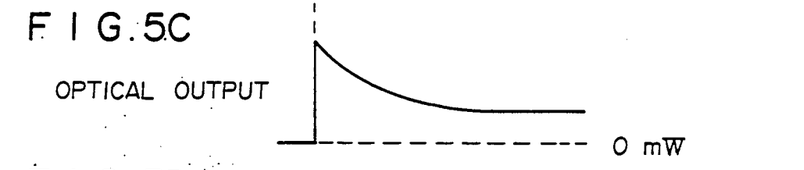

However, in the case where the light emission level instructing signal Vref is of a high frequency, different problems further arise as described below. FIG. 4 is a graph showing dependence of the drive current-optical output characteristics of the semiconductor laser as shown in FIG. 2 on the temperature in the case housing of the semiconductor laser. As shown in FIG. 4, when the drive current is constant, the optical output of the semiconductor laser is lower as the temperature in the case housing of the semiconductor laser is higher. In general, in the case where the semiconductor laser is applied to a laser beam recording apparatus or the like, the apparatus is provided with a control means for maintaining the temperature in the case housing of the semiconductor laser at a predetermined value. However, it is impossible to restrict even transitional variations of the temperature of a laser diode chip arising when the drive current is applied to the semiconductor laser. FIGS. 5A, 5B, 5C, 5D and 5E are explanatory graphs showing the drooping characteristics of the semiconductor laser. Specifically, at the time the drive current is applied step-wise to the semiconductor laser as shown in FIG. 5A, the temperature of the laser diode chip changes transitionally as shown in FIG. 5B until it comes into the steady condition by the aforesaid control for maintaining the temperature in the case housing of the semiconductor laser at a predetermined value. As a result, in accordance with the characteristics as shown in FIG. 4, the optical output of the semiconductor laser changes as shown in FIG. 5C. Such changes in the optical output are referred to as the drooping characteristics of the semiconductor laser.

Figure 5D:
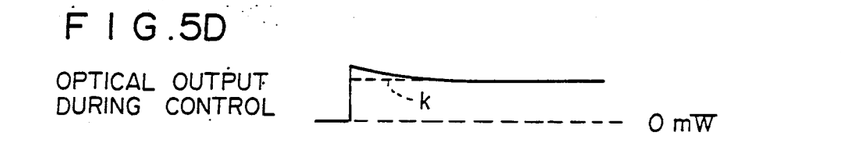

FIG. 5C shows the characteristics of the semiconductor laser itself. In the case where the optical output of the semiconductor laser is controlled by the APC circuit as shown in FIG. 3, the operation of the semiconductor laser is stabilized, but the effects of the drooping characteristics still remain uneliminated as shown in FIG. 5D. When the optical output of the semiconductor laser changes as shown in FIG. 5D, the problem that, for example, the density of the recorded image fluctuates with the passage of time with respect to the same image signal arises.

In the case where the loop gain of the APC circuit is adjusted to be very high, the effects of the drooping characteristics can be eliminated almost completely. However, in order to record the continuous tone image as mentioned above, the light emission response characteristics of the semiconductor laser must be substantially increased in the case where the semiconductor laser is to be operated by quickly changing the light emission level instructing signal Vref analog-wise. Actually, for this reason, the loop gain of the APC circuit cannot be adjusted to be so high.

SUMMARY OF THE INVENTION

The primary object of the present invention is to provide a drooping elimination device for a semiconductor laser, which minimizes fluctuations in the optical output of the semiconductor laser caused by drooping characteristics, even though the loop gain of an APC circuit is comparatively low.

Another object of the present invention is to provide a drooping elimination device for a semiconductor laser, which enables the recording of a fine continuous tone image with good gradation reproducibility.

The present invention provides a drooping elimination device for a semiconductor laser in a laser beam recording apparatus provided with:

(i) a semiconductor laser for emitting a laser beam, (ii) a beam scanning system for scanning the laser beam on a photosensitive material, (iii) a laser operation control circuit for producing a light emission level instructing signal corresponding to an image signal, and controlling a drive current for the semiconductor laser on the basis of the light emission level instructing signal, thereby to modulate the optical intensity of the laser beam, and (iv) an optical output stabilizing circuit for detecting the optical intensity of said laser beam, and feeding back a feedback signal corresponding to the detected optical intensity to said light emission level instructing signal, the drooping elimination device for a semiconductor laser comprising:

(a) a feedback line for detecting said drive current for said semiconductor laser and feeding back a signal corresponding to the detected drive current to said light emission level instructing signal, and (b) a high-pass filter having a time constant approximately equal to the time constant of drooping characteristics of said semiconductor laser, and provided in said feedback line to receive said detected drive current.

Figure 5E:
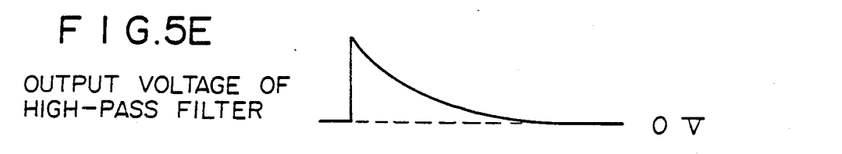

At the time a voltage that rises step-wise is fed to the high-pass filter, the output of the high-pass filter changes as shown in FIG. 5E. Therefore, in the case where the output of the high-pass filter is fed back (negative feedback) to the light emission level instructing signal, the drive current for the semiconductor laser is decreased by the feedback signal as indicated by the broken line "h" in FIG. 5A. As a result, the optical output of the semiconductor laser changes as indicated by the broken line "k" in FIG. 5D. Accordingly, the time constant of the high-pass filter is adjusted to be approximately equal to the time constant of the drooping characteristics of the semiconductor laser, and the gain of the feedback line is adjusted to an appropriate value. In this manner, changes in the optical output of the semiconductor laser caused by the drooping characteristics can almost be cancelled by changes in the optical output caused by the feedback signal.

Accordingly, with the drooping elimination device for a semiconductor laser in accordance with the present invention, transitional and minute fluctuations in the optical intensity of the laser beam caused by the drooping characteristics of the semiconductor laser can be prevented, thereby to enable the recording of a fine continuous tone image with good gradation reproducibility in a laser beam recording apparatus for recording a continuous tone image by modulating analog-wise the optical intensity of the laser beam emitted by the semiconductor laser.

DESCRIPTION OF THE PREFERRED EMBODIMENTS

The present invention will hereinbelow be described in further detail with reference to the accompanying drawings.

Figure 1:
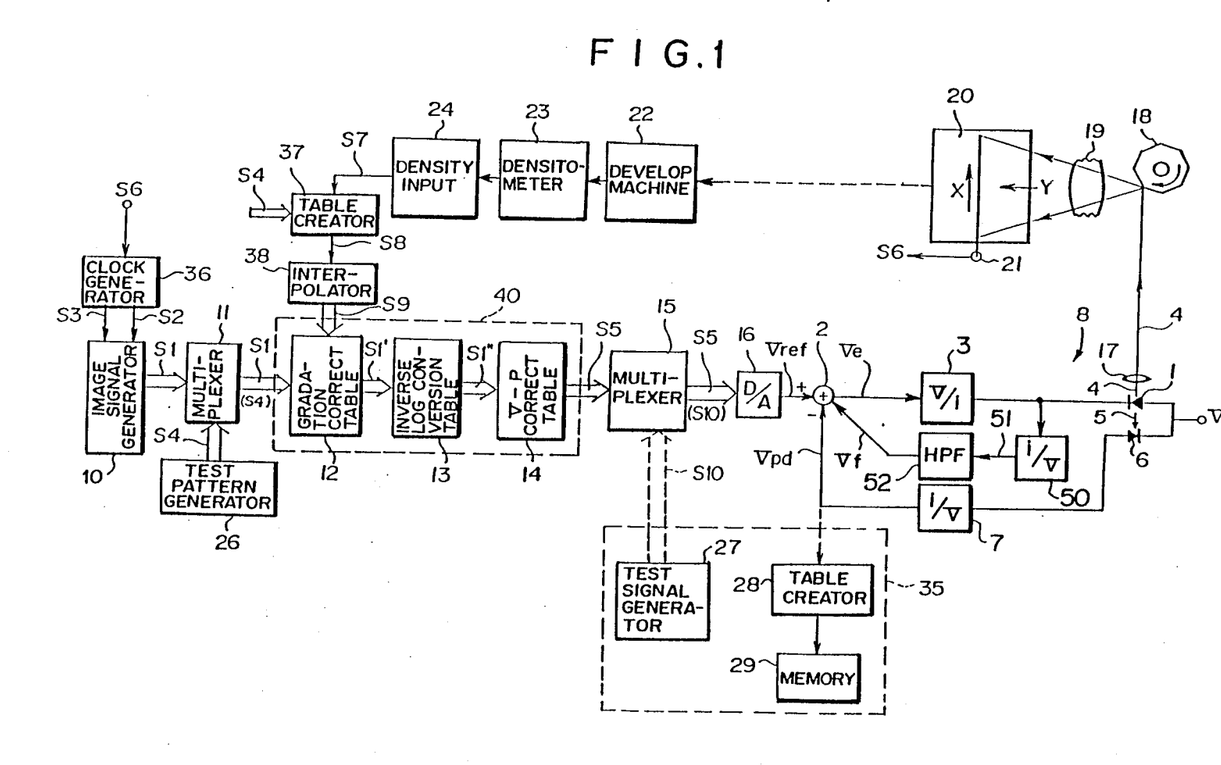
FIG. 1 is a schematic view showing a laser beam recording apparatus provided with an embodiment of the drooping elimination device for a semiconductor laser in accordance with the present invention.

With reference to FIG. 1, an image signal generator 10 generates an image signal S1 representing a continuous tone image. By way of example, the image signal S1 is a digital signal representing a continuous tone image of a density scale of 10 bits. The image signal generator 10 changes over the signal for a single main scanning line on the basis of a line clock S2 as will be described later, and outputs the image signal S1 at each picture element based on a picture element clock S3. In this embodiment, the picture element clock frequency is adjusted to 1 MHz. In other words, the recording time for a single picture element is adjusted to 1 μsec.

The image signal S1 is corrected as will be described below by a correction table 40 comprising a RAM via a multiplexer 11, and is converted into a light emission level instructing signal S5 of 16 bits for example. The light emission level instructing signal S5 is fed to a multiplexer 15 and then to a D/A converter 16, and is converted by the D/A converter 16 into a light emission level instructing signal Vref composed of an analog voltage signal. The light emission level instructing signal Vref is fed to an addition point 2 of an APC circuit 8. The addition point 2, a voltage-to-current conversion amplifier 3, a semiconductor laser 1, a photodiode 6, and a current-to-voltage conversion amplifier 7 of the APC circuit 8 are equivalent to the ones in the circuit mentioned above with reference to FIG. 3. Therefore, a laser beam 4 of an intensity corresponding to the light emission level instructing signal Vref, i.e. to the image signal S1, is emitted by the semiconductor laser 1. The laser beam 4 is collimated by a collimator lens 17, and is then reflected and deflected by a light deflector 18 constituted by a polygon mirror or the like. The laser beam 4 thus deflected is passed through a converging lens 19 normally constituted by an fθ lens, is converged into a minute spot on a photosensitive material 20, and scans the photosensitive material 20 in a main scanning direction as indicated by the arrow X. The photosensitive material 20 is moved by a movement means (not shown) in a sub-scanning direction as indicated by the arrow Y approximately normal to the main scanning direction X, and thus is scanned with the laser beam 4 in the sub-scanning direction Y. In this manner, the photosensitive material 20 is two-dimensionally scanned with and exposed to the laser beam 4. Since the laser beam 4 is intensity modulated based on the image signal S1 as mentioned above, the continuous tone image which the image signal S1 represents is recorded as a photographic latent image on the photosensitive material 20. When the laser beam 4 scans on the photosensitive material 20, passage of the laser beam 4 over a start point of the main scanning is detected by a photodetector 21, and a start point detection signal S6 generated by the photodetector 21 is fed to a clock generator 36. The clock generator 36 outputs the aforesaid line clock S2 and the picture element clock S3 in synchronization with the input timing of the start point detection signal S6.

Then, the photosensitive material 20 is sent to a developing machine 22 and is subjected to development processing. Thus the continuous tone image is developed as a visible image on the photosensitive material 20.

Correction of the image signal S1 by the correction table 40 will be described hereinbelow. The correction table 40 comprises a gradation correction table 12, an inverse logarithmic conversion table 13, and a correction table 14 (hereinafter referred to as the V-P characteristics correction table) for making linear the optical output characteristics of the semiconductor laser 1 with respect to the light emission level instructing signal. The gradation correction table 12 is of the known type for correcting the gradation characteristics of the photosensitive material 20 and the development processing system. The gradation correction table 12 may be of the fixed correction characteristics type. However, in this embodiment, by taking into consideration changes of the gradation characteristics of the photosensitive material 20 among the lots thereof, changes of characteristics of the developing solution in the developing machine 22 with passage of time, or the like, the gradation correction table 12 is constituted for changing the correction characteristics when necessary in accordance with actual gradation characteristics. Specifically, a test pattern signal S4 representing some steps (e.g. 16 steps) of image density on the photosensitive material 20 is generated by a test pattern generating circuit 26, and is fed to the multiplexer 11. At this time, the multiplexer 11 is changed over from the condition at the time of image recording for feeding the image signal S1 to the correction table 40 as mentioned above to the condition for feeding the test pattern signal S4 to the correction table 40. The semiconductor laser 1 is operated in the manner as mentioned above on the basis of the test pattern signal S4, and therefore the laser beam 4 is intensity modulated. As a result, a step wedge (test pattern) whose density changes step-wise, for example, in 16 steps, is recorded as a photographic latent image on the photosensitive material 20. The photosensitive material 20 is sent to the developing machine 22, and the step wedge is developed. After the development is finished, the photosensitive material 20 is sent to a densitometer 23, and the optical density at each step of the step wedge is measured. The optical density thus measured is sent to a density value input means 24 in conformity with each step of the step wedge, and a density signal S7 representing the optical density of each step of the step wedge is generated by the density value input means 24. The density signal S7 is fed to a table creation means 37. On the basis of the density signal S7 and the test pattern signal S4, the table creation means 37 creates the gradation correction table such that predetermined image density is obtained with a predetermined value of the image signal S1. As mentioned above, the gradation correction table makes the image signal values of approximately 16 steps correspond respectively to predetermined image density values. A signal S8 representing the gradation correction table is fed to a signal interpolation means 38, which carries out interpolation processing to obtain a gradation correction table adapted to the image signal S1 of 1024 steps (i.e. 10 bits). The aforesaid gradation correction table 12 is created on the basis of a signal S9 representing the thus obtained gradation correction table.

In the course of image recording based on the image signal S1, the image signal S1 fed to the gradation correction table 12 via the multiplexer 11 is converted to a signal S1' by the gradation correction table 12, and is then converted by the inverse logarithmic conversion table 13 into a light emission level instructing signal S1".

The V-P characteristics correction table 14 will now be described below. As mentioned above, even though the feedback signal Vpd is fed back to the addition point 2 in the APC circuit 8, it is not always possible to obtain the ideal relationship between the light emission level instructing signal and the intensity of the laser beam 4 as indicated by a straight line "a" in FIG. 6. The V-P characteristics correction table 14 is provided for obtaining such an ideal relationship. Specifically, the ideal relationship between the light emission level instructing signal Vref and the optical output of the semiconductor laser 1 is indicated by the straight line "a" in FIG. 6, the actual relationship therebetween is indicated by a curve "b" in FIG. 6, and the voltage value at the time the light emission level instructing signal S1" is directly D/A converted is assumed to be equal to Vin. In this case, the V-P characteristics correction table 14 is constituted to convert the voltage value Vin to a voltage value V. When the value of the light emission level instructing signal Vref is equal to Vin, only the optical intensity equal to P' can be obtained. However, in the case where the voltage value Vin is converted to the voltage value V as mentioned above, the optical intensity equal to Po can be obtained with respect to the voltage value Vin. Thus the relationship between the voltage value Vin corresponding to the light emission level instructing signal S1" and the optical output Pf becomes linear.

With the aforesaid configuration, density on the photosensitive material 20 can be controlled at equal density intervals by changing the level of the image signal S1 by a predetermined amount. Also, as mentioned above, the characteristic curve "b" shown in FIG. 6 is for the case where the semiconductor laser 1 is operated over the LED region and the laser oscillation region. Therefore, with the aforesaid embodiment, an optical output dynamic range of approximately 3 orders of magnitude can be obtained, and consequently a high-gradation image of approximately 1024 levels of gradation can be recorded easily and accurately as mentioned above.

As mentioned above, nonlinearity of the laser beam optical output characteristics with respect to the light emission level instructing signal, which nonlinearity is caused by nonlinearity of the optical output characteristics of the semiconductor laser 1 with respect to the drive current, is eliminated and said characteristics are made linear by the V-P characteristics correction table 14. Accordingly, the loop gain of the system of the APC circuit 8 passing through the addition point 2, the voltage-to-current conversion amplifier 3, the semiconductor laser 1, the photodiode 6, and the current-to-voltage conversion amplifier 7 and then returning to the addition point 2 need not include the gain necessary for the correction for eliminating the aforesaid nonlinearity. Thus it is only necessary that the loop gain be of a value required for the compensation for deviations of the optical output characteristics of the semiconductor laser 1 with respect to the drive current which are caused by error in the control for making constant the temperature in the case housing of the semiconductor laser 1, and for the compensation for drifts of the amplifiers or the like. Specifically, in the case where the picture element clock frequency is 1 MHz and the semiconductor laser 1 is operated to generate an optical output of 3 mW, it is only necessary that the aforesaid loop gain be approximately 30 dB. The loop gain of this order can be achieved easily with the present technical level.

Figure 6:
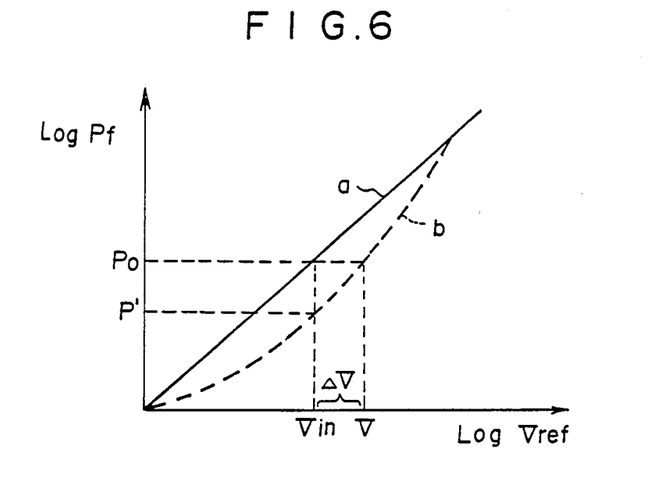
FIG. 6 is an explanatory graph showing the effects of the V-P characteristics correction table in the laser beam recording apparatus shown in FIG. 1.

Creation of the V-P characteristics correction table 14 will be described hereinbelow. To the apparatus shown in FIG. 1, a table creation device 35 can be connected when necessary. The table creation device 35 comprises a test signal generating circuit 27, a table creation circuit 28 and a memory 29. When the V-P characteristics correction table 14 is to be created, a variable-level digital test signal S10 is generated by the test signal generating circuit 27 and is fed to the multiplexer 15. At this time, the multiplexer 15 is changed over from the condition for feeding the light emission level instructing signal S5 to the D/A converter 16 in the course of image recording to the condition for feeding the test signal S10 to the D/A converter 16. Also, the table creation circuit 28 is connected so that it receives the feedback signal Vpd from the current-to-voltage conversion amplifier 7 of the APC circuit 8. The test signal S10 is output such that the signal level increases or decreases step-wise. At this time, the table creation circuit 28 activates a variable-level signal generator built therein to generate a reference signal corresponding to the minimum optical output, and compares the feedback signal Vpd with the reference signal. The reference signal has the voltage value Vin as shown in FIG. 6. The table creation circuit 28 latches the value of the test signal S10 at the time the feedback signal Vpd and the reference signal coincide with each other. The voltage value represented by the latched test signal S10 corresponds to the voltage value V as shown in FIG. 6, and therefore the relationship between the voltage value Vin and the voltage value V can be found. The table creation circuit 28 changes the value of the reference signal in 1024 steps, and detects the relationship between the voltage value Vin and the voltage value V for each reference signal value. In this manner, the correction table for converting 1024 levels of the voltage value Vin to the voltage value V is created. The creation table thus created is stored in the memory 29, and is then set as the V-P characteristics correction table 14. After the V-P characteristics correction table 14 is created in this manner, the table creation device 35 is disconnected from the APC circuit 8.

Instead of detecting one by one the relationships between the voltage value Vin and the voltage value V for all image density levels in the manner as mentioned above, the V-P characteristics correction table 14 may also be created by detecting the relationships between the voltage value Vin and the voltage value V for some major image density levels and carrying out signal interpolation in the same manner as in the creation of the gradation correction table 12. The V-P characteristics correction table 14 may also be created by calculation based on the V-P characteristics of the semiconductor laser 1. Also, the gradation correction table 12, the inverse logarithmic conversion table 13, and the V-P characteristics correction table 14 may be combined into a single correction table having all of the necessary conversion characteristics, or may be constituted independently of one another.

Figure 7:
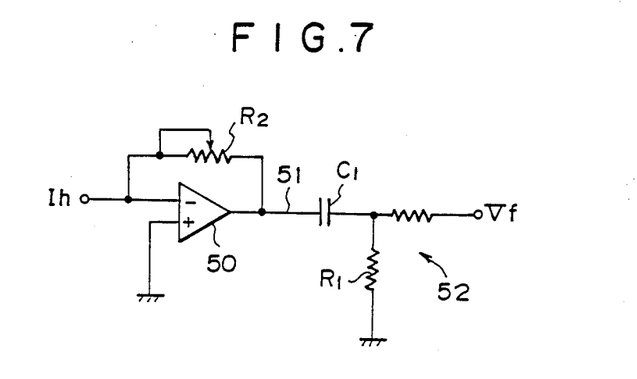
FIG. 7 is a circuit diagram showing in detail the embodiment of the drooping elimination device for a semiconductor laser as shown in FIG. 1.

As mentioned above, even though the loop gain of the APC circuit 8 is adjusted to approximately 30 dB, it is not always possible to completely restrict fluctuations in the optical output of the semiconductor laser 1 caused by the drooping characteristics of the semiconductor laser 1. The embodiment of the drooping elimination device in accordance with the present invention for preventing such problems will be described hereinbelow. With reference to FIG. 1, the drooping elimination device comprises a feedback line 51 including a voltage-to-current conversion amplifier 50 and constituted for detecting the drive current applied to the semiconductor laser 1 and feeding back (negative feedback) a voltage signal Vf corresponding to the detected drive current to the addition point 2, and a high-pass filter 52 provided in the stage after the voltage-to-current conversion amplifier 50 in the feedback line. A feedback resistor R2 of the voltage-to-current conversion amplifier 50 is constituted by a variable resistor, so that the gain of the voltage-to-current conversion amplifier 50 is adjustable. Also, as shown in detail in FIG. 7, the high-pass filter 52 is constituted by a CR circuit comprising a capacitor C1 and a resistor R1.

A current Ih of a level equal or proportional to the level of the current applied to the semiconductor laser 1 is fed to the voltage-to-current conversion amplifier 50, and is converted to a voltage signal. The voltage signal is fed to the high-pass filter 52. As mentioned above, in the case where the current Ih rises step-wise, i.e. in the case where the current applied to the semiconductor laser 1 changes in this manner, the output voltage Vf of the high-pass filter 52 responds as shown in FIG. 5E. Therefore, at the time the voltage signal Vf is fed back to the light emission level instructing signal Vref, the current applied to the semiconductor laser 1 changes as indicated by the broken line "h" shown in FIG. 5A. The time constant of the high-pass filter 52 is adjusted to be equal to the time constant of the drooping characteristics of the semiconductor laser 1, and the variable resistor R2 is operated to change the loop gain of the feedback line 51, thereby to adjust the value of the feedback signal Vf to an appropriate value. In this manner, fluctuations in the optical output caused by changes in the applied current as indicated by the broken line "h" are cancelled with fluctuations in the optical output caused by the drooping characteristics. Specifically, the optical output of the semiconductor laser 1 changes as indicated by the broken line "k" in FIG. 5D. Thus, apparently, the optical output of the semiconductor laser 1 responds completely step-wise when the applied current 5 changing completely step-wise as indicated by the solid line in FIG. 5A is given.

The drooping characteristics of the semiconductor laser 1 differs in accordance with the level of the optical output of the semiconductor laser 1. Therefore, the gain adjustment of the voltage-to-current conversion amplifier 50 should preferably be carried out in the vicinity of the threshold current value of the semiconductor laser 1 at which the effects of the drooping characteristics arise most readily.

Also, the gain of the voltage-to-current conversion amplifier 50 need not necessarily be made adjustable, and may be fixed to match the drooping characteristics of the semiconductor laser 1.

I claim:

1. A drooping elimination device for a semiconductor laser in a laser beam recording apparatus for recording an image on a photosensitive material in accordance with an image signal, said apparatus including:
   (i) a semiconductor laser for emitting a laser beam,
   (ii) a beam scanning system for scanning the laser beam on said photosensitive material.
   (iii) a laser operation control circuit for producing a light emission level instructing signal corresponding to said image signal, and controlling a drive current for the semiconductor laser on the basis of the light emission level instructing signal, thereby to modulate the optical intensity of the laser beam, and
   (iv) an optical output stabilizing circuit for detecting the optical intensity of said laser beam, and feeding back a feedback signal corresponding to the detected optical intensity to said light emission level instructing signal to stabilize the optical intensity of said laser beam.
   the drooping elimination device for a semiconductor laser eliminating change in output of said semiconductor laser because of a rise in temperature, and comprising:
   (a) a feedback line for detecting said drive current for said semiconductor laser and feeding back a signal corresponding to the detected drive current to said light emission level instructing signal, and
   (b) a high-pass filter having a time constant approximately equal to a time constant of output change of said semiconductor laser as a function of temperature, and provided in said feedback line to receive said detected drive current, wherein an output of said high-pass filter is applied so as to make the optical intensity of said semiconductor change in a step-wise fashion in response to a step-wise change in said drive current.

2. A device as defined in claim 1 wherein said feedback line is provided with a gain adjusting means for adjusting the amount of feedback effected by said feedback line.

3. A device as defined in claim 2 wherein said gain adjusting means comprises a current-to-voltage conversion amplifier provided with a variable resistor.

4. A device as defined in claim 1 wherein said high-pass filter is constituted by a CR circuit comprising a capacitor and a resistor.

5. An apparatus as defined in any of claims 1 to 4 wherein said laser operation control circuit is provided with a correction table for correcting said light emission level instructing signal to selectively provide one of a corrected light emission level instructing signal and an uncorrected light emission level instructing signal so as to compensate for nonlinearity of optical output characteristics of said semiconductor laser with respect to the drive current, thereby to make linear the relationship between the optical output of said semiconductor laser based on said corrected light emission level instructing signal and said uncorrected light emission level instructing signal.

* * * * *